US009965208B1

United States Patent
Roohparvar et al.

(10) Patent No.: US 9,965,208 B1
(45) Date of Patent: May 8, 2018

(54) MEMORY DEVICE HAVING A CONTROLLER TO ENABLE AND DISABLE MODE CONTROL CIRCUITRY OF THE CONTROLLER

(71) Applicant: Micron Technology, Inc., Boise, ID (US)

(72) Inventors: Frankie F. Roohparvar, Monte Sereno, CA (US); Luca De Santis, Avezzano (IT); Tommaso Vali, Sezze (IT); Kenneth J. Eldredge, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 13/774,688

(22) Filed: Feb. 22, 2013

Related U.S. Application Data

(60) Provisional application No. 61/602,364, filed on Feb. 23, 2012.

(51) Int. Cl.
*G06F 3/06* (2006.01)
*G06F 11/22* (2006.01)
*G06F 11/10* (2006.01)

(52) U.S. Cl.
CPC .......... *G06F 3/0634* (2013.01); *G06F 3/0626* (2013.01); *G06F 3/0679* (2013.01); *G06F 3/0688* (2013.01); *G06F 11/1064* (2013.01); *G06F 11/2263* (2013.01)

(58) Field of Classification Search
None
See application file for complete search history.

(56) References Cited

U.S. PATENT DOCUMENTS

| | | | |
|---|---|---|---|
| 4,326,259 A * | 4/1982 | Cooper et al. | 708/212 |
| 5,751,987 A * | 5/1998 | Mahant-Shetti et al. | 711/5 |
| 6,020,759 A * | 2/2000 | Heile | 326/40 |
| 6,400,635 B1 * | 6/2002 | Ngai et al. | 365/230.05 |
| 7,190,190 B1 * | 3/2007 | Camarota et al. | 326/38 |
| 2005/0056869 A1 * | 3/2005 | Ichige | G11C 16/0483 257/222 |
| 2008/0316843 A1 * | 12/2008 | Kim | 365/191 |

* cited by examiner

*Primary Examiner* — Reginald G Bragdon
*Assistant Examiner* — Edward Wang
(74) *Attorney, Agent, or Firm* — Dicke, Billig & Czaja, PLLC

(57) ABSTRACT

Configurable operating mode memory devices are disclosed. In at least one embodiment, a memory device is configurable into one or more operating modes. An array of memory cells can be allocated into one or more partitions where each partition is associated only with a particular mode of operation. In at least one other embodiment, a memory device is configured to store user data in a portion of a memory array and to store data corresponding to a logical function associated with a different operating mode of the memory device in a different portion of the memory array.

35 Claims, 4 Drawing Sheets

MEMORY DEVICE HAVING A CONTROLLER TO ENABLE AND DISABLE MODE CONTROL CIRCUITRY OF THE CONTROLLER

RELATED APPLICATION

This application is a non-provisional of provisional application U.S. Ser. No. 61/602,364, filed Feb. 23, 2012, titled "CONFIGURABLE OPERATING MODE MEMORY DEVICE," which is related to provisional application U.S. Ser. No. 61/476,574, filed Apr. 18, 2011, titled "METHODS AND APPARATUS FOR PATTERN MATCHING" which is commonly assigned.

TECHNICAL FIELD

The present disclosure relates generally to memory and in particular, in one or more embodiments, the present disclosure relates to configuring and operating memory devices in one or more of a plurality of operating modes.

BACKGROUND

Memory devices are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and Flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Flash memory devices are commonly used in electronic systems, such as personal computers, personal digital assistants (PDAs), digital cameras, digital media players, digital recorders, games, appliances, vehicles, wireless devices, cellular telephones, and removable memory modules, and the uses for Flash memory continue to expand.

Many electronic systems utilize multiple types of devices (e.g., multiple types of circuitry) to function, such as processors, logic circuitry and various types of memory. For example, many systems use programmable logic devices (PLDs). Programmable logic devices typically are semiconductor devices which are configured to perform a particular logic function in response to the configuration of the PLD device. Many electronic systems utilize various types of memory devices, such as random access memory (RAM) and read only memory (ROM.) Some examples of these memories are SRAM, DRAM, Flash and content addressable memories (CAM.)

The demand to reduce component count and reduce the physical size of electronic systems along with a demand for increased processing capability continues to increase. Thus, a reduction in the number and types of devices in electronic systems while maintaining the same functionality might facilitate a reduction in complexity and/or component count of electronic systems which might facilitate a reduction in overall system costs.

For the reasons stated above, and for other reasons stated below which will become apparent to those skilled in the art upon reading and understanding the present specification, there is a need in the art for memory devices which are configurable to operate in one or more of a plurality of operating modes previously provided by multiple types of devices in electronic systems.

DETAILED DESCRIPTION

Figure 1:
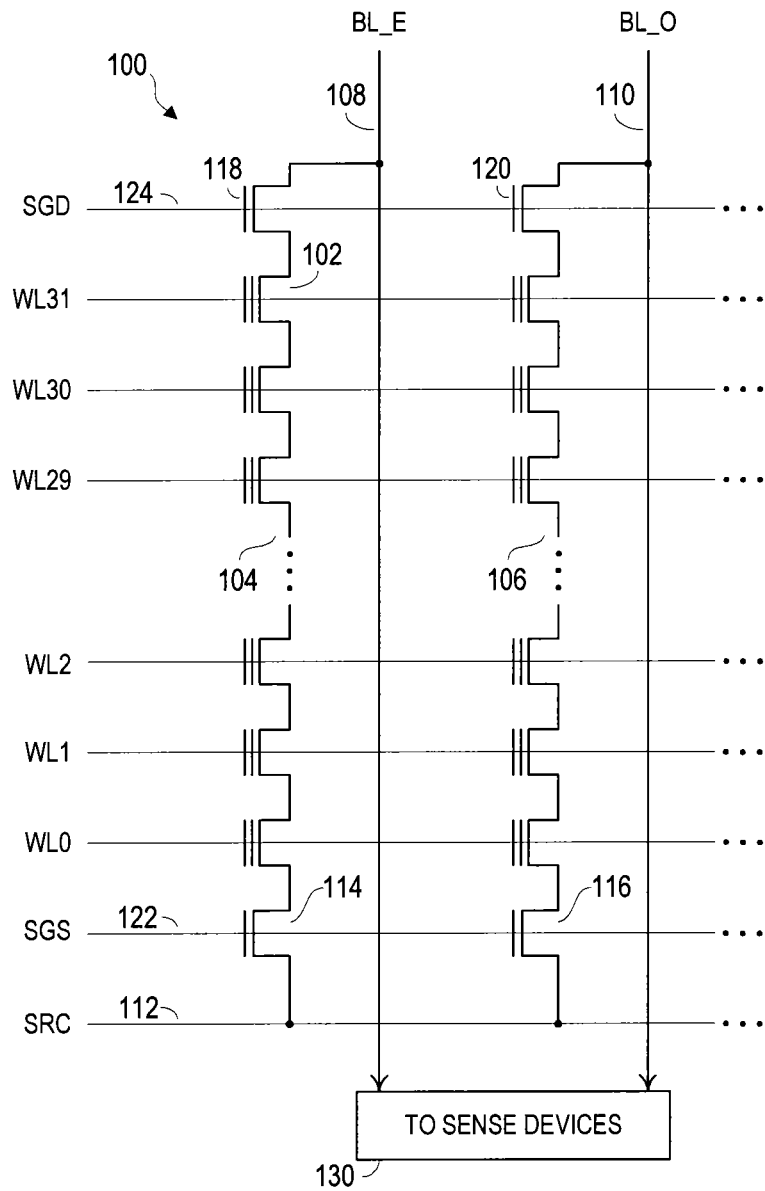
FIG. 1 illustrates a schematic representation of an array of NAND configured memory cells.

In the following detailed description of the invention, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Flash memory typically utilizes one of two basic architectures known as NOR Flash and NAND Flash. The designation is derived from the logic used to read the devices. In NOR Flash architecture, a logical column of memory cells is coupled in parallel with each memory cell coupled to a data line, such as those typically referred to as digit (e.g., bit) lines. In NAND Flash architecture, a column of memory cells is coupled in series with only the first memory cell of the column coupled to a bit line.

The memory array 100 comprises an array of non-volatile memory cells 102 (e.g., floating gate) arranged in columns such as series strings 104, 106. Each of the cells is coupled drain to source in each series string 104, 106. An access line (e.g., word line) WL0-WL31 that spans across multiple series strings 104, 106 is coupled to the control gates of each memory cell in a row in order to bias the control gates of the memory cells in the row. Data lines, such as even/odd bit lines BL_E 108, BL_O 110, are coupled to the series strings and eventually coupled to sense circuitry 130 (e.g., sense devices) that detects the state of each cell by sensing current or voltage on a selected bit line. The bit lines BL_E 108, BL_O 110 are also coupled to page buffers (not shown) that can be programmed by data from each selected word line. The sense circuitry and page buffers may be part of the same circuitry or the page buffers can be separate circuitry.

Each series string 104, 106 of memory cells is coupled to a source line 112 by a source select gate 114, 116 (e.g., transistor) and to an individual even or odd bit line BL_E, BL_O by a drain select gate 118, 120 (e.g., transistor). The source select gates 114, 116 are controlled by a source select gate control line SGS 122 coupled to their control gates. The drain select gates 118, 120 are controlled by a drain select gate control line SGD 124.

In a typical programming of the memory array, each memory cell is individually programmed as either a single level cell (SLC) or a multiple level cell (MLC). The cell's threshold voltage ($V_t$) can be used as an indication of the data stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multiple level cells can take advantage of the analog nature of a traditional charge storage cell by assigning a bit pattern to a specific $V_t$ range.

Figure 2:
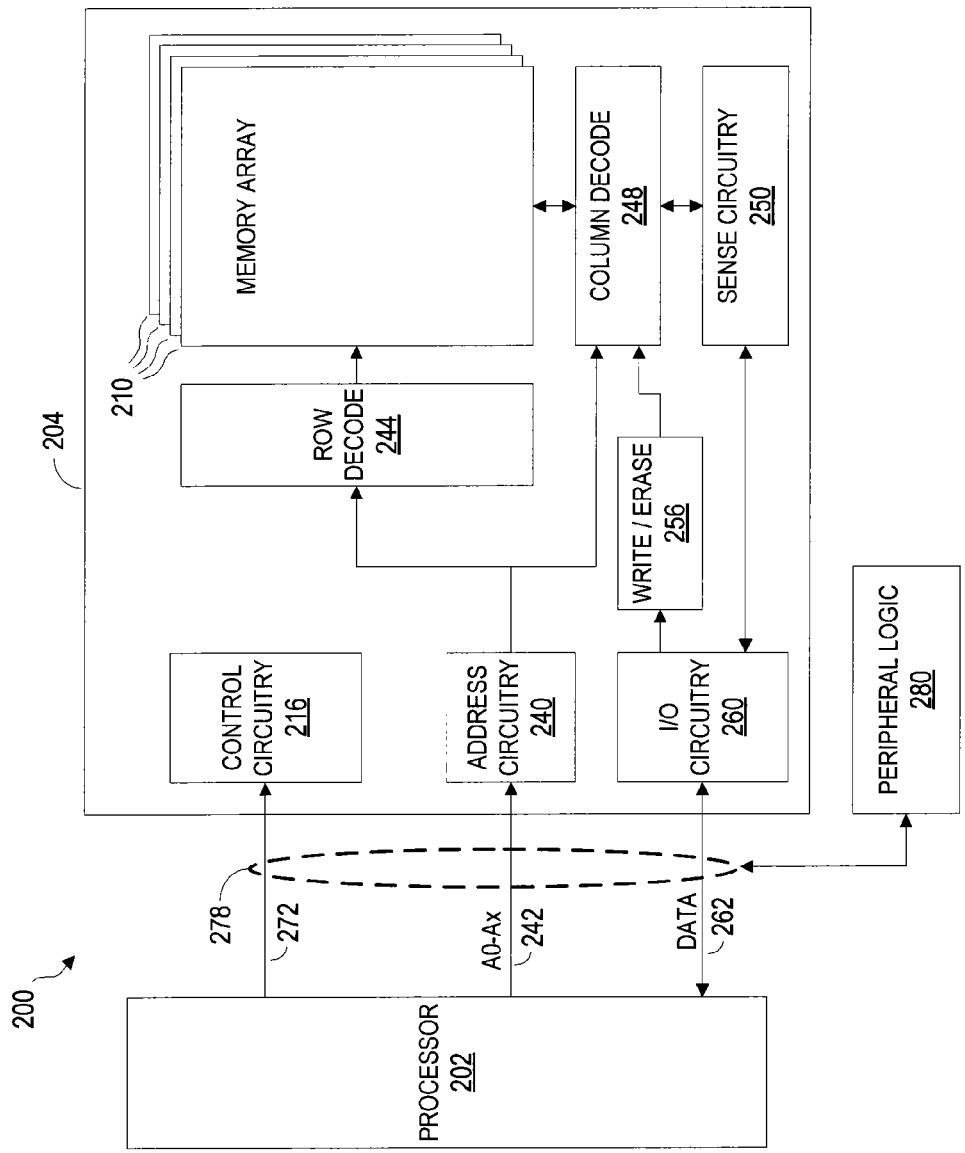
FIG. 2 is simplified block diagram of a typical memory device coupled to a memory access device as part of an electronic system.

FIG. 2 illustrates a block diagram of a typical electronic system 200 comprising a memory access device 202 (e.g., processor), a memory device 204 and one or more peripheral devices 280. The memory device 204 of FIG. 2 includes an array of memory cells 210, such as an array of charge storage memory cells, for example. The memory device 204 comprises additional circuitry, such as control circuitry 216, input/output (I/O) circuitry 260, address circuitry 240, write/erase circuitry 256, row decode 244 and column 248 decode circuitry and sense circuitry 250. The memory device 204 might be coupled to the memory access device 202 by an interface 278 which comprises one or more communications channels, such as control lines 272, address lines 242 and data lines 262.

FIG. 2 further illustrates one or more peripheral devices 280 that might be included in the electronic system of FIG. 2. These peripheral devices 280 (e.g., peripheral logic) might be coupled to one or more of the communications channels (e.g., 272, 242, 262) comprising the interface 278, for example. These peripheral devices can increase the complexity and cost of the electronic system. Further, some of these peripheral devices have fixed configurations that are application specific and cannot be reconfigured. For example, the peripheral device 280 might comprise a programmable logic device (PLD), for example. Memory devices according to one or more embodiments of the present disclosure facilitate incorporating the functionality of one or more of these peripheral devices within a memory device of the electronic system.

Figure 3:
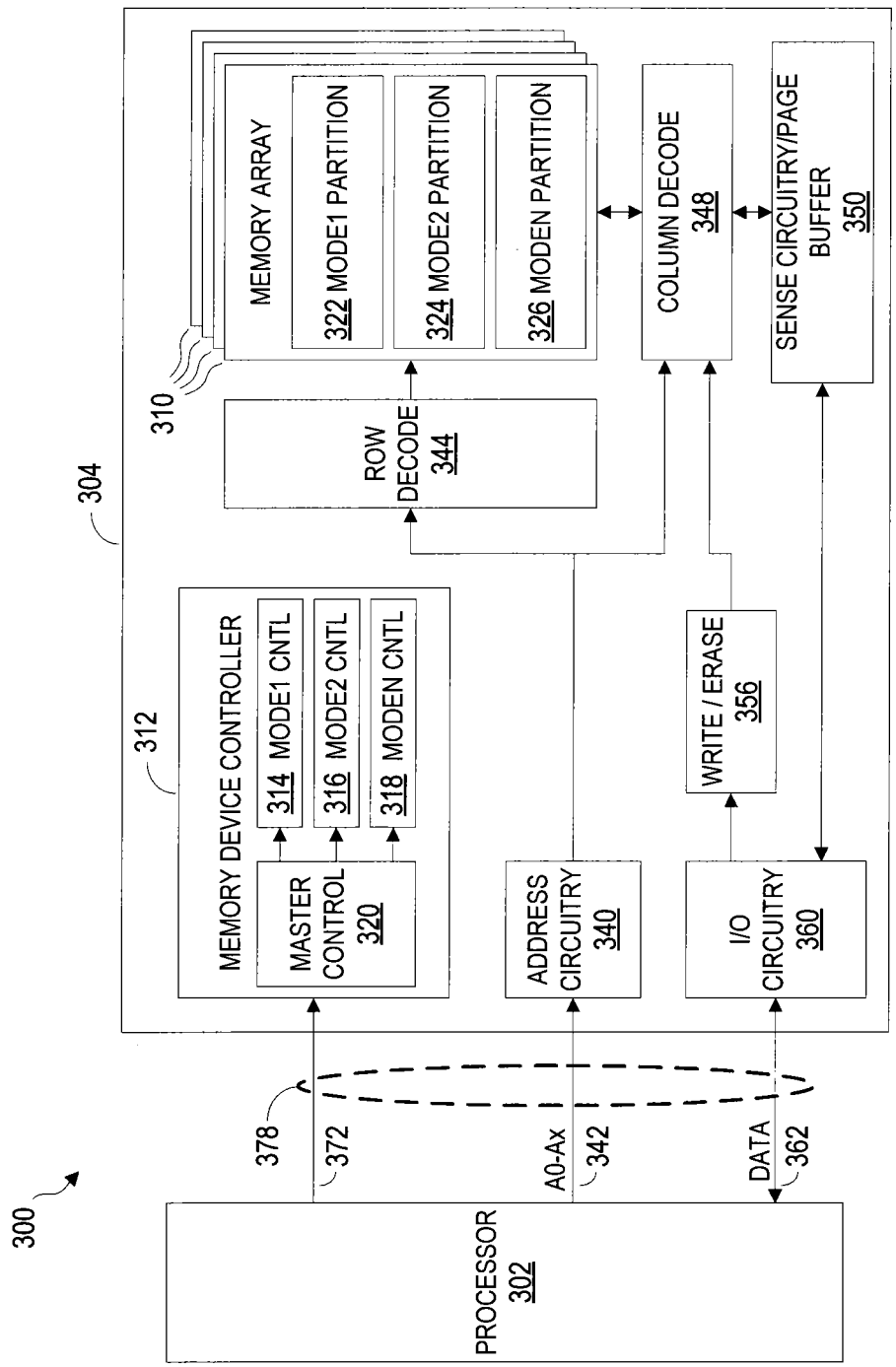
FIG. 3 is a simplified block diagram of a memory device coupled to a memory access device as part of an electronic system according to an embodiment of the present disclosure.

FIG. 3 is a functional block diagram of an electronic system 300 having at least one memory device 304 according to one or more embodiments of the present disclosure. The memory device 304 illustrated in FIG. 3 is coupled to a memory access device 302, such as a processor. The memory access device 302 might be a microprocessor or some other type of controlling circuitry. The memory access device 302 is coupled to the memory device 304 by an interface 378. The interface 378 comprises one or more communications channels, such as command lines 372, address lines 342 and/or data lines 362. The interface 378 might comprise a number of standard interfaces, such as a Universal Serial Bus (USB) interface, for example. The interface 378 might be a standard interface used with many hard disk drives (e.g., SATA, PATA) as are known to those skilled in the art. Together, the memory device 304 and the processor 302 form part of the electronic system 300. The memory device 304 has been simplified to focus on features of the memory device that are helpful in understanding various embodiments of the present disclosure.

The memory device 304 includes one or more arrays of memory cells 310 that can be logically arranged in rows and columns. According to one or more embodiments, the memory cells of memory array 310 are charge storage memory cells having a NAND array configuration. The memory array 310 can include multiple banks, blocks, pages and strings (e.g., NAND strings) of memory cells residing on a single or multiple die as part of the memory device 304. Memory array 310 might comprise SLC and/or MLC memory. The memory array 310 might also be adaptable to store varying densities (e.g., MLC (four level) and MLC (eight level)) of data in each cell, for example.

An address buffer circuit 340 is provided to latch address signals provided on address input channels AO-Ax 342. Address signals are received and decoded by the row decoder 344 and the column decoder 348 to access the memory array 310. Row decoder 344 might comprise driver circuits (not shown) configured to drive the word lines of the memory array 310, for example. Row decoder 344 might comprise row buffer circuits (not shown.). The driver circuits of the row decoder 344 might be configured to drive the word lines of the memory array 310 responsive to data stored in the row buffer circuits, for example. It will be appreciated by those skilled in the art, with the benefit of the present description, that the number of address input channels 342 might depend on the density and architecture of the memory array 310. That is, the number of address digits increase with both increased memory cell counts and increased bank and block counts, for example.

The memory device 304 reads data in the memory array 310 by sensing voltage or current changes in the memory array columns using sense circuitry 350. The sense circuitry/page buffer 350, in at least one embodiment, is coupled to read and latch a row of data from the memory array 310. The sense circuitry/page buffer 350 can move data to the row buffer circuits (not shown) as well. Data input and output (I/O) buffer circuitry 360 is included for bi-directional data communication over one or more data channels 362 with the processor 302. Write/erase circuitry 356 is provided to write data to or to erase data from the memory array 310.

Control signals and commands can be sent by the processor 302 to the memory device 304 over the command communication channels (e.g., bus) 372. The command bus 372 may be a discrete signal line or may be comprised of multiple signal lines, for example. Signals on the command bus 372 are used to control the operations on the memory array 310, including data read, data write (e.g., program), and erase operations.

A controller 312 of the memory device 304 is configured, at least in part, to implement various embodiments of the present disclosure. Memory device controller 312 can comprise, for example, control circuitry (such as control circuitry 216), firmware and/or software. Controller 312 might be coupled (not shown) to one or more of the elements of the memory device 304. According to one or more embodiments, controller 312 and/or firmware or other circuitry can individually, in combination, or in combination with other elements of the memory device 304, form an internal controller. As used herein, however, a controller need not necessarily include any or all of such components. In some embodiments, a controller can comprise an internal controller (e.g., located on the same die as the memory array) and/or an external controller. In at least one embodiment, the control circuitry 312 may utilize a state machine.

Memory device controller 312 might be configured to operate the memory device 304 in one or more of a plurality of operating modes. For example, the memory device 304 might be at least partially or wholly configured to function as a memory device (e.g., a standard memory storage device) wherein data (e.g., user data) is stored in the memory array and is accessed and output in response to a write and/or read request from the memory access device 302 coupled to the memory device 304. Memory device controller 312 might be configured to facilitate moving data within the memory device, such as from the page buffer 350 to the row buffers as discussed above, for example. The memory device controller might be configured to facilitate moving data into and/or out of the memory device 305, such as in communicating with the processor 302, for example. The memory device 304 can be configured to program memory cells of the memory array 310 as SLC and/or MLC memory.

The memory device 304 of FIG. 3 may be further configured to operate in one or more other operating modes in addition to a user data storage operating mode according to various embodiments of the present disclosure. These operating modes facilitate functions which might have previously been performed by peripheral devices, such as peripheral device 280, discussed above with respect to FIG. 2, for example. One of these additional modes of operation can comprise at least a portion of the memory device 304 being configured to operate as a Programmable Logic Device (PLD.) A description of an implementation of a PLD within a memory device, such as in a NAND Flash memory device, is disclosed in provisional application U.S. Ser. No. 61/602,249, which is commonly assigned. A portion of the memory device controller 312 of memory device 304, such as MODE1 CNTL 314 may be configured to facilitate operating at least a portion of the memory device 304 in a PLD operating mode, for example.

According to one or more embodiments of the present disclosure, the memory device 304 can be at least partially configured as a content addressable memory (CAM) memory device. For example, a portion of the memory device controller 312, such as MODE2 CNTL 316, can be configured to facilitate operating at least a portion of the memory device 304 in a CAM operating mode. Such a memory device operating mode might be utilized to perform pattern matching operations, for example. A description of an implementation of a CAM device, such as implemented in a NAND Flash memory device, is disclosed in U.S. Provisional Application No. 61/476,574, filed Apr. 18, 2011, which is commonly assigned.

A CAM operating mode of the memory device 304 according to one or more embodiments of the present disclosure might comprise a number of different CAM operating modes. For example, the memory device 304, at least in part, can be configured as a Memory Read Compare and/or a Parallel Compare Mode CAM device. In the Memory Read Compare configuration, a particular input (e.g., feature vector or key) is compared to data stored in particular memory locations within the memory array 310 (e.g., a data vector) to attempt to determine if a match exists between stored data and the particular input. A Parallel Compare Mode configuration can be used to facilitate comparisons responsive to a particular type of feature vector, for example. Feature vectors might be generated by a memory access device 302 and transmitted over one or more communications channels of the interface 378 as an input to the memory device 304, for example.

Weighting functions, such as utilized by a CAM device, can be implemented within a memory device 304 according to various embodiments of the present disclosure. A description of weighting functions, such as implemented in a NAND configured Flash memory device, is disclosed in provisional application U. S. Ser. No. 61/587,337 and provisional application U.S. Ser. No. 61/625,286, which are commonly assigned. Additional embodiments utilize 'don't care' functions with regard to an incoming feature vector and/or to data that might be stored in the memory array 310. A description of implementing 'don't care' functions, such as utilized in a NAND configured Flash memory device, is disclosed in provisional application U.S. Ser. No. 61/625,283, which is commonly assigned.

Memory devices 304 according to various embodiments of the present disclosure can be configured to, at least in part, facilitate operating at least a portion of the memory device in a neural network operating mode. A description of implementing a neural network in a memory device, such as in a NAND configured Flash memory device, is disclosed in provisional application U.S. Ser. No. 61/602,344, which is commonly assigned.

Memory device controller 312 might comprise additional control circuitry, such as Master Control circuitry 320, in addition to the operating mode specific control circuitry 314-318, for example. The master control circuitry 320 is configured to facilitate various operations within the memory device, such as read, write and erase operations, for example. Master control circuitry 320 can comprise, for example, firmware and/or software. The master control circuitry 320 also manages the various operating modes of the memory device 304 by enabling and/or disabling one or more operating modes of the memory device 304. MODE1 CNTL control circuitry 314 might be enabled which facilitates a user data storage operating mode whereas MODE2 CNTL control circuitry 316 might be enabled which facilitates a PLD operating mode in the memory device, for example.

The master control circuitry 320 can enable and/or disable various operating modes within the memory device responsive to commands received from the processor 302, for example. Thus, according to various embodiments of the present disclosure, the master control circuitry 320 might enable and/or disable the MODE1 CNTL 314-MODEN CNTL 318 control circuitry responsive to a particular operating mode that has been selected for the memory device 304. For example, a user might select that the memory device 304 is to operate in both a user data storage and CAM operating mode. However, various embodiments according to the present disclosure are not limited to two operating modes. For example, the memory device 304 can be configured to operate solely in one of the operating modes discussed above (e.g., user data storage, CAM, PLD, etc.). According to additional embodiments, the memory device may be configured to operate in two or more operating modes, for example.

FIG. 3 illustrates MODE1 CNTL, MODE2 CNTL and MODEN CNTL as separate blocks of circuitry. However, according to various embodiments, control circuitry of the memory device controller 312 might be utilized by more than one portion of the mode control circuitry (e.g., MODE1 CNTL, MODE2 CNTL and MODEN CNTL). For example, MODE1 CNTL control circuitry and MODE2 CNTL control circuitry might both utilize a common group of data registers to facilitate their respective operating modes, for example. MODE1 CNTL-MODEN CNTL can comprise, for example, firmware and/or software. In addition, two or more different operating modes might utilize the same control circuitry of the memory device controller. MODE1 CNTL 314 might be configured to facilitate a PLD operating mode and a CAM operating mode in the memory device, for example. The memory device controller 312 might be further configured to independently control word line drivers of the memory device.

Memory array 310 might be allocated into one or more portions (e.g., partitions) according to various embodiments of the present disclosure. Each portion (e.g., partition) 322-326 of the memory array 310 is associated with a selected operating mode in order to facilitate the functionality of the selected operating modes. FIG. 3 illustrates partitions MODE1 PARTITION-MODEN PARTITION 322-326 which correspond with the control circuitry MODE1 CNTL-MODEN CNTL 314-318, respectively. Thus, an operating mode associated with control circuitry MODE1 CNTL 314 utilizes the memory array partition MODE1 PARTITION 322, an operating mode associated with control circuitry MODE2 CNTL 316 utilizes the memory array partition MODE2 PARTITION 324, etc. The one or more partitions 322-326 need not be the same size and can be reallocated according to various embodiments of the present disclosure. Each partition 322-326 associated with each operating mode might be assigned by particular strings, pages, blocks or different memory array die within the memory device, for example.

The number of partitions of the memory array may be a different number than that of the possible operating modes for a memory device according to various embodiments of the present disclosure. For example, a memory device according to various embodiments which may be configurable into four operating modes will not necessarily be allocated into four partitions. The number of memory array partitions might match the number of operating modes that the memory device has been configured to operate in at any given time. Alternatively, more than one partition can be associated with a particular operating mode. A memory device configured to operate in one operating mode might comprise a memory array having one or more partitions associated with the one operating mode. Should the memory device be reconfigured to operate in three modes, the array can be reallocated into three partitions to facilitate the three operating modes, for example.

Operation of a memory device according to one or more embodiments of the present disclosure is further described by way of example. A memory device, such as memory device 304, may be configured to operate in a user data storage operating mode, a PLD operating mode and a CAM operating mode. A memory access device (e.g., host), such as processor 302, may wish to perform a user data storage operation in the memory device, such as a read operation, for example. The processor 302 might transmit an address of a particular memory location in the memory array partition associated with the user data storage operating mode. Further, the processor 302 might transmit a command indicating to the memory device 304 that a user data memory partition access is desired. Thus, the memory device controller 312 facilitates a read operation responsive to the received read command and the received address from the processor 302. The memory device 304 then transfers the data read from the particular address location on the data lines 362 to the processor 302, for example.

Continuing with the present example, the processor might wish to perform a PLD operation within the memory device 304. The processor 302 might transmit a particular command to the memory device 304 over the command bus 372 which indicates a PLD operation is desired. The processor 302 might further transfer data over the data lines 362 to the memory device 304. The data is to be acted upon by one or more PLD logic functions facilitated by the programmed state of one or more memory cells of the memory array partition associated with the PLD operating mode. The data might comprise a data pattern, such as a bit pattern or a pattern representative of the bit pattern. The memory device controller 312 can be configured to apply the data pattern to one or more word lines coupled to memory cells of the PLD partition of the memory array. The memory device can be further configured to generate a logical function result responsive to the data pattern applied to the word lines and the programmed states of the memory cells. This logical function result may be transferred from the memory device 304 to the processor 302 according to one or more embodiments of the present disclosure. According to one or more additional embodiments, the logical function result might comprise a data pattern to be applied to a different partition of the memory array resulting in a second logical function result which may be transferred to the processor 302, for example.

Continuing with the present example, the processor 302 might wish to perform a CAM operation within the memory device 304. The processor 302 might transmit a command to the memory device 304, such as over the command bus 372, to indicate a CAM operating mode operation is desired. The processor 302 might further transmit a data pattern associated with the command to the memory device 304 over the data bus 362. Memory device controller 312 of the memory device responds to the CAM operating mode command and the data pattern received over the data bus 362. The memory device controller 312 accesses the particular partition of the memory array associated with the CAM operating mode of the memory device. The memory device controller facilitates a comparison of the received data pattern with data stored in the CAM partition of the memory array. The memory device might further indicate whether a partial and/or complete match has been made between the data pattern and data stored in the associated partition of the memory array. For example, the memory device may transmit to the processor 302 an indication whether a match was found and/or an address in the CAM partition indicating where the match occurred. It should be noted that, according to one or more embodiments, a particular partition of the memory array is only accessed responsive to performing a particular function associated with a particular operating mode. For example, in performing a function associated with the CAM operating mode, only memory array partitions associated with the CAM operating mode are accessed.

Figure 4:
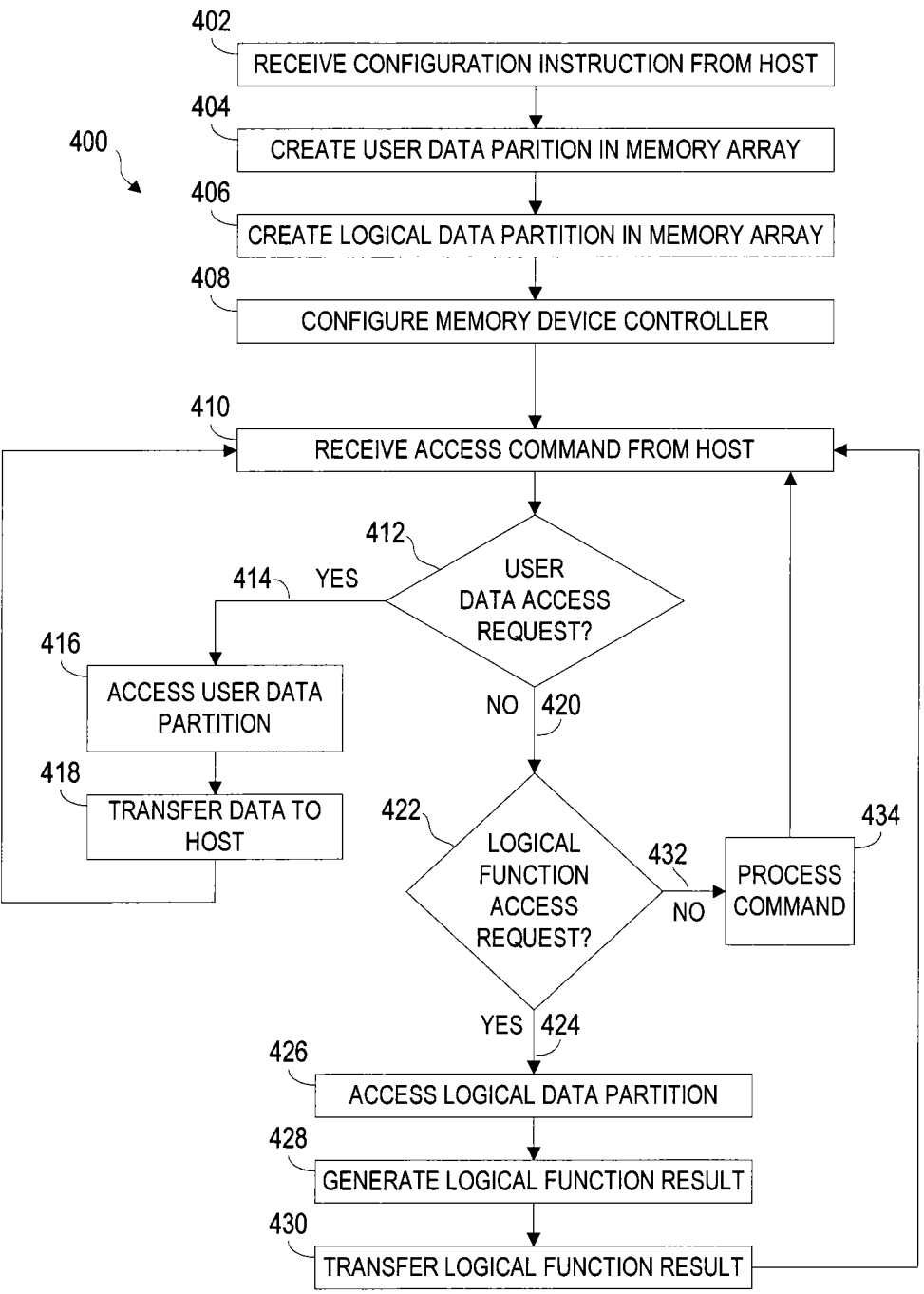
FIG. 4 is a flowchart illustrating a method of operating a memory device according to an embodiment of the present disclosure.

FIG. 4 illustrates a flowchart 400 of a method of operating a memory device according to an embodiment of the present disclosure. A memory device, such as memory device 304, might receive a configuration instruction from a host 402 coupled to the memory device. The received configuration instruction might comprise an indication of one or more selected operating modes (e.g., user data storage, PLD, CAM, neural network, etc.) for the memory device to be configured to operate in. Responsive to receiving the configuration instruction, a user data partition of the memory array of the memory device might be created 404. A logical data partition of the memory array might be created 406 to store data corresponding to one or more logical functions, for example. The memory device controller 312 might be at least partially configured 408 to operate the memory device in the selected operating modes indicated by the received configuration instruction.

Following configuration of the memory device, an access command might be received 410 by the memory device from the host. The memory device controller determines 412 if the received access command comprises a request to access the user data partition of the memory device. If the access command indicates access to the user data partition is desired 414, the memory device controller accesses the user data partition 416 and performs the specific operation to be performed. For example, the user data partition access request may be associated with a user data programming (e.g., write) operation to be performed in the user data partition. A user data partition access request might also comprise a user data read operation to be performed. The memory device controller might facilitate the read request and transfer the data read from the user data partition to the host 418.

If the received access command 410 does not comprise a user data partition access request 420, a determination is made 422 if the received access command comprises a logical function access request, such as to access a logical data partition of the memory array, for example. The received access command might not correspond to an access request to access the logical data partition 432. The memory device controller might then process the received access command 434 in response to the received command. For example, the received access command might comprise one or more additional commands related to memory device operation not specific to accessing the user data partition or the logical data partition of the memory device. Such commands might include initialization commands, device status (e.g., ready/busy) requests, etc.

If the received access command corresponds to a logical data partition access request 424, the memory device controller facilitates an access of the logical data partition 426. The received access command might comprise a data pattern (e.g., bit pattern). The memory device controller generates a logical function result 428 responsive to the received data pattern and data stored in the logical data partition. The memory device controller then facilitates a transfer of the logical function result to the host 430.

A first operating mode of the memory device can use a second operating mode of the memory device according to various embodiments of the present disclosure. Referring again to FIG. 3, the memory device 304 can be configured such that a first portion of the memory device configured to operate in a first operating mode can access and/or otherwise interact with a second portion of the memory device which is configured to operate in a second operating mode. Memory device control circuitry facilitating a neural network operational mode of the memory device can be configured to interact with control circuitry of the memory device which may be facilitating a CAM operation mode within the same memory device, for example. Further, the memory device might receive input data from a processor as discussed above. The memory device controller 312 might store (e.g., temporarily store) the input data in a user data storage partition of the memory array until it is retrieved to be utilized by a PLD operating mode of the memory device, for example. A logical function result, such as generated by a PLD or a CAM operating mode of the memory device might be stored (e.g., buffered) in the user data storage partition of the memory array. At a later time, the logical function result stored in the user data partition of the array can be transferred from the memory device 304, such as responsive to a request from a processor coupled to the memory device, for example.

It should be noted that the memory device 304 can be configured to concurrently operate in one or more operating modes. Programming particular memory cells and/or partitions of memory cells associated with each operating mode might comprise performing a common programming operation (e.g., to facilitate threshold voltage shift.) For example, a programming operation to adjust a threshold voltage of a memory cell in a PLD partition of the memory device might be the same programming operation to adjust a threshold voltage of a memory cell in a CAM partition of the memory device. Thus, memory cells might experience similar biasing conditions to shift their respective threshold voltages during programming. However, the resulting threshold voltages of the various memory cells may vary between the different partitions of the memory device. CAM memory cells may be programmed as SLC memory cells whereas the user storage memory cells may be programmed as MLC memory cells, for example.

Further, memory device controller 312 facilitates a re-configuration of the memory device 304 according to one or more embodiments of the present disclosure. The memory device 304 might have a first selected configuration of operational modes. At a different time, the memory device 304 might be re-configured to have a second selected configuration of operational modes. The re-configured memory device (e.g., configured in the second configuration) might comprise different operating modes than the first configuration. Alternatively, the second configuration might facilitate the same operating modes but utilize different portions of the memory array. For example, the first configuration may comprise a user data storage operating mode and a CAM operating mode. It might be determined that more space in the memory array is desired to serve as user data storage space and less space in the array is desired to support the CAM operating mode. Thus, a memory device according to one or more embodiments can be re-configured to have the same operating modes yet have a different allocation of memory array space assigned to each operating mode, for example.

A memory device according to various embodiments might also be configured to have two or more of the same type of operating modes but with different associated functions. For example, a memory device can be configured to facilitate two different PLD functions within the memory device. For example, control circuitry MODE1 CNTL 314 and MODE1 PARTITION 322 might be configured to facilitate a first PLD logical function. Control circuitry MODE2 CNTL 316 and MODE2 PARTITION 324 might be configured to facilitate a second PLD logical function.

Although not shown in FIG. 3, more than one memory device according to various embodiments of the present disclosure, such as memory device 304, might be coupled to the communications channels 378 of the electronic system 300. A first memory device may be configured to operate in one or more of a plurality of operating modes and a second memory device may be configured to operate in one or more of a plurality of operating modes. The configuration of the first and the second memory devices might be the same or might be different according to various embodiments of the present disclosure. Further, as discussed above, the first and the second memory devices might be reconfigurable to facilitate different operating modes at different times, for example. Although references have been made to one or more embodiments according to the present disclosure utilizing Flash memory, various embodiments are not so limited.

CONCLUSION

Memory devices configurable into one or more of a plurality of operating modes and methods of operating such configurable memory devices have been described. In particular, NAND memory devices, for example might be configurable to operate concurrently in a user data storage mode and one or more different operating modes. Such memory devices can be configured to store user data and to facilitate functionality of programmable logic devices and/or content addressable memory devices, for example.

Although specific embodiments have been illustrated and described herein, it will be appreciated by those of ordinary skill in the art that any arrangement, which is calculated to achieve the same purpose, may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device, comprising:
a NAND memory array comprising a plurality of NAND strings, wherein each NAND string comprises a plurality of one-transistor memory cells coupled in series with each other; and
a memory controller, comprising master control circuitry and a plurality of mode control circuitries, wherein the mode control circuitries of the plurality of mode control circuitries respectively correspond to operating modes of a plurality of operating modes of the memory device, wherein the master control circuitry is configured to enable and disable one or more of the plurality of mode control circuitries;
wherein a first one of the plurality of operating modes is associated with a first portion of the NAND memory array and a second one of the plurality of operating modes is associated with a second portion of the NAND memory array;
wherein the memory device is further configured to concurrently operate the memory device in two or more different operating modes of the plurality of operating modes; and
wherein the memory device is further configured to operate the first one of the plurality of operating modes and the second one of the plurality of operating modes using a common programming operation to program memory cells of the first portion of the NAND memory array and the second portion of the NAND array, respectively.

2. The memory device of claim 1, wherein the memory device is further configured to only access the first portion of the NAND memory array in response to enabling a first one of the plurality of mode control circuitries to operate the memory device in the first one of the plurality of operating modes and to only access the second portion of the NAND memory array in response to enabling a second one of the plurality of mode control circuitries to operate the memory device in the second one of the plurality of operating modes.

3. The memory device of claim 1, wherein the first and the second portions of the NAND memory array comprise first and second partitions of the NAND memory array.

4. The memory device of claim 1, wherein the master control circuitry is configured to reconfigure the memory controller by disabling one or more of the plurality of mode control circuitries that are enabled and/or by enabling one or more of the plurality of mode control circuitries that are disabled.

5. The memory device of claim 4, wherein the master control circuitry is further configured to reallocate the NAND memory array responsive to reconfiguring the memory controller.

6. The memory device of claim 1, wherein each portion of the NAND memory array comprises a respective NAND string of the plurality of NAND strings.

7. The memory device of claim 1, wherein the plurality of operating modes includes a user data storage operating mode.

8. The memory device of claim 1, wherein the plurality of operating modes includes a programmable logic device (PLD) operating mode.

9. The memory device of claim 1, wherein to the plurality of operating modes includes a content addressable memory (CAM) operating mode.

10. A memory device, comprising:
a NAND memory array comprising a plurality of NAND strings, wherein each NAND string comprises a plurality of one-transistor memory cells coupled in series with each other; and
a memory controller, comprising master control circuitry and a plurality of mode control circuitries, the mode control circuitries of the plurality of mode control circuitries respectively corresponding to operating modes of a plurality of operating modes of the memory device, wherein the master control circuitry is configured to configure the memory controller in one configuration by enabling one or more mode control circuitries of the plurality of mode control circuitries and configured to reconfigure the memory controller in a different configuration by enabling one or more different mode control circuitries of the plurality of mode control circuitries, each operating mode facilitating a respective function;
wherein a particular portion of the NAND memory array is associated with a particular one of the plurality of operating modes and is accessed only in response to performing a particular function associated with the particular one of the plurality of operating modes;
wherein the particular portion of the NAND memory array comprises a particular NAND string of the plurality of NAND strings;
wherein the memory device is further configured to concurrently operate the memory device in two or more different operating modes of the plurality of operating modes;
wherein an other portion of the NAND memory array is associated with an other one of the plurality of operating modes; and
wherein the memory device is to program the particular portion of the NAND memory array and the other portion of the NAND memory array using a same programming operation.

11. A memory device, comprising:
a NAND memory array comprising a plurality of NAND strings, wherein each NAND string comprises a plurality of one-transistor memory cells coupled in series with each other; and
a memory controller, comprising master control circuitry and a plurality of mode control circuitries, the mode control circuitries of the plurality of mode control circuitries respectively corresponding to operating modes of a plurality of operating modes of the memory device, wherein the master control circuitry is configured to enable and disable one or more of the plurality of mode control circuitries, wherein a respective function is associated with each operating mode;
wherein a first portion of the NAND memory array is associated with a first one of the plurality of mode control circuitries that corresponds to a first one of the plurality of operating modes and a second portion of the NAND memory array is associated with a second one of the plurality of mode control circuitries that corresponds to a second one of the plurality of operating modes;
wherein the first portion of the NAND memory array is only accessed in response to performing the respective function associated with the first one of the plurality of operating modes and the second portion of the NAND memory array is only accessed in response to performing the respective function associated with the second one of the plurality of operating modes;

wherein the memory device is further configured to concurrently operate the memory device in two or more different operating modes of the plurality of operating modes; and wherein the memory device is further configured to operate the first one of the plurality of operating modes and the second one of the plurality of operating modes using a common programming operation to program memory cells of the first portion of the NAND memory array and the second portion of the NAND array, respectively.

12. The memory device of claim 11, wherein the memory device is further configured to store logical data in the first portion of the NAND memory array, where the stored logical data corresponds to a particular logical function.

13. The memory device of claim 12, wherein the memory device is further configured to change the logical data stored in the first portion of the NAND memory array, where the changed logical data corresponds to a different logical function than the particular logical function.

14. The memory device of claim 12, wherein the memory device is further configured to store user data in the second portion of the NAND memory array.

15. The memory device of claim 14, wherein the memory device is further configured to transfer from the memory device the user data stored in the second portion of the NAND memory array responsive to accessing the second portion of the NAND memory array.

16. The memory device of claim 12, wherein the memory device is further configured to transfer from the memory device a logical function result generated responsive to accessing the first portion of the NAND memory array.

17. The memory device of claim 16, wherein the memory device is further configured to apply a data pattern to the first portion of the NAND memory array.

18. The memory device of claim 17, wherein the logical function result is generated responsive to applying the data pattern to the first portion of the NAND memory array.

19. The memory device of claim 11, wherein the memory device is further configured to reconfigure one or more of the plurality of operating modes of the memory device.

20. The memory device of claim 19, wherein the memory device is further configured to reallocate the NAND memory array to create new portions in the NAND memory array.

21. The memory device of claim 20, wherein the memory device is further configured to reallocate the NAND memory array responsive to reconfiguring the one or more of the plurality of operating modes of the memory device.

22. The memory device of claim 11, wherein the plurality of operating modes includes a content addressable memory (CAM) operating mode.

23. The memory device of claim 11, wherein the plurality of operating modes includes a programmable logic device (PLD) operating mode.

24. The memory device of claim 11, wherein the plurality of operating modes includes a neural network operating mode.

25. An electronic system, comprising:
a communications channel;
a memory access device coupled to the communications channel and configured to generate memory device commands; and
a memory device coupled to the communications channel and configured to be responsive to the memory device commands, the memory device comprising:
   a NAND memory array comprising a plurality of NAND strings, wherein each NAND string comprises a plurality of one-transistor memory cells coupled in series with each other; and
   a memory controller, comprising master control circuitry and a plurality of mode control circuitries, the mode control circuitries of the plurality of mode control circuitries respectively corresponding to operating modes of a plurality of operating modes of the memory device, wherein the master control circuitry is configured to enable and disable one or more of the plurality of mode control circuitries, wherein a respective function is associated with each operating mode;
wherein a first portion of the NAND memory array is associated with a first one of the plurality of mode control circuitries that corresponds to a first one of the plurality of operating modes and a second portion of the NAND memory array is associated with a second one of the plurality of mode control circuitries that corresponds to a second one of the plurality of operating modes;
wherein the first portion of the NAND memory array is only accessed in response to performing the respective function associated with the first one of the plurality of operating modes and the second portion of the NAND memory array is only accessed in response to performing the respective function associated with the second one of the plurality of operating modes;
wherein the memory device is further configured to concurrently operate the memory device in two or more different operating modes of the plurality of operating modes; and
wherein the memory device is further configured to operate the first one of the plurality of operating modes and the second one of the plurality of operating modes using a common programming operation to program memory cells of the first portion of the NAND memory array and the second portion of the NAND array, respectively.

26. The electronic system of claim 25, wherein the memory access device is further configured to generate memory device commands indicative of a selected operating mode of the memory device.

27. The electronic system of claim 26, wherein the memory access device is further configured to transmit to the memory device a data value associated with a generated memory device command indicative of the selected operating mode of the memory device.

28. A method of operating a memory device, the method comprising:
enabling first mode control circuitry of a memory controller to operate the memory device in a first operating mode, wherein the first mode control circuitry corresponds to a first portion of a NAND memory array, the NAND memory array comprising a plurality of NAND strings, wherein each NAND string comprises a plurality of one-transistor memory cells coupled in series with each other, the first portion of the NAND memory array configured to store user data;
storing user data in the first portion of the NAND memory array using a particular programming operation when the first mode control circuitry is enabled;

transferring the user data stored in the first portion of the NAND memory array responsive to accessing the first portion of the NAND memory array when the first mode control circuitry is enabled;

enabling second mode control circuitry of the memory controller to operate the memory device in a second operating mode concurrently with the first operating mode, wherein the second operating mode is different than the first operating mode, wherein the second mode control circuitry corresponds to a second portion of the NAND memory array, the second portion of the NAND memory array configured to store logical data corresponding to a logical function;

storing data in the second portion of the NAND memory array using the particular programming operation when the second mode control circuitry is enabled;

applying a data pattern to the second portion of the NAND memory array in response to receiving the data pattern when the second mode control circuitry is enabled; and generating a logical function result responsive to applying the data pattern to the second portion of the NAND memory array when the second mode control circuitry is enabled.

29. The method of claim 28, further comprising transferring the logical function result from the memory device after generating the logical function result.

30. The method of claim 28, further comprising reallocating the first and/or second portion of the NAND memory array to change a number of the NAND strings, of the plurality of NAND strings, assigned to the first and/or second portion, respectively.

31. A method of operating a memory device, the method comprising:
enabling first mode control circuitry of a memory controller to operate the memory device in a first operating mode;
accessing a first portion of a NAND memory array, the NAND memory array comprising a plurality of NAND strings, wherein each NAND string comprises a plurality of one-transistor memory cells coupled in series with each other, when the first mode control circuitry is enabled;
storing data in the first portion of the NAND memory array using a particular programming operation when the first mode control circuitry is enabled;
transferring the data stored in the first portion of the NAND memory array responsive to accessing the first portion of the NAND memory array;
receiving a particular command and a data pattern;
enabling second mode control circuitry of the memory controller in response to the particular command to operate the memory device in a second operating mode concurrently with the first operating mode, wherein the second operating mode is different than the first operating mode;
storing data in a second portion of the NAND memory array using the particular programming operation when the second mode control circuitry is enabled;
applying the received data pattern only to the second portion of the NAND memory array when the second mode control circuitry is enabled; and
generating a logical function result responsive to applying the data pattern to the second portion of the NAND memory array.

32. The method of claim 31 wherein the first type of data comprises user data.

33. The method of claim 31, wherein the second type of data comprises logical data corresponding to a logical function.

34. The method of claim 33, further comprising changing the logical function by reprogramming the one-transistor memory cells in the NAND strings in the second portion of the NAND memory array.

35. The memory device of claim 10, wherein the particular portion of the NAND memory array is a CAM portion of the NAND memory array and the particular one of the plurality of operating modes is a CAM operating mode and the other portion of the NAND memory array is a PLD portion of the NAND memory array, and wherein the other one of the plurality of operating modes is a PLD operating mode.

* * * * *